United States Patent [19]
Voogel

[11] Patent Number: 5,959,821
[45] Date of Patent: Sep. 28, 1999

[54] TRIPLE-WELL SILICON CONTROLLED RECTIFIER WITH DYNAMIC HOLDING VOLTAGE

[75] Inventor: Martin L. Voogel, Santa Clara, Calif.

[73] Assignee: Xilinx, Inc., San Jose, Calif.

[21] Appl. No.: 09/109,479

[22] Filed: Jul. 2, 1998

[51] Int. Cl.[6] ........................................... H02H 3/22
[52] U.S. Cl. ................................. 361/111; 361/56
[58] Field of Search .......................... 361/56, 91, 111; 257/355–363

[56] References Cited

U.S. PATENT DOCUMENTS

| | | | |
|---|---|---|---|
| 5,012,317 | 4/1991 | Rountre | 257/173 |
| 5,452,171 | 9/1995 | Metz et al. | 361/56 |
| 5,528,188 | 6/1996 | Au et al. | 327/310 |

OTHER PUBLICATIONS

"The Programmable Logic Data Book" copyright 1996, Xilinx, Inc., 2100 Logic Drive, San Jose, CA 95124, pp. 3–3 through 3–13.

*Primary Examiner*—Michael J. Sherry
*Attorney, Agent, or Firm*—Patrick T. Bever; Bever & Hoffman; Jeanette S. Harms

[57] ABSTRACT

An electrostatic discharge (ESD) protection circuit for an IC device including a triple-well SCR and a control circuit connected between the triple-well SCR and ground. The triple-well SCR is implemented using triple-well CMOS technology to facilitate connection of the control circuit by isolating both terminals of the triple-well SCR from ground. The control circuit includes a switch circuit, a capacitor, or a combination thereof, for controlling the holding voltage of the triple-well SCR. The switch circuit is closed during non-operation (i.e., before power is applied to the IC device protected by the SCR) so that electrostatic discharge (ESD) energy is transmitted to ground through the triple-well SCR. Similarly, the capacitor transmits ESD pulses to ground during ESD events. During normal operation of the IC device, the switch circuit is controlled by system voltage to remain open. In contrast, the capacitor is charged when a voltage pulse triggers the triple-well SCR during normal IC operation, thereby reliably switching off the triple-well SCR by decreasing the voltage across the SCR below the holding voltage.

21 Claims, 5 Drawing Sheets

TRIPLE-WELL SILICON CONTROLLED RECTIFIER WITH DYNAMIC HOLDING VOLTAGE

FIELD OF THE INVENTION

This invention relates to electrostatic discharge (ESD) protection circuits that protect integrated circuit devices from externally-generated voltage pulses, and more specifically to silicon controlled rectifiers (SCRs) that are used, for example, in ESD protection circuits.

BACKGROUND OF THE INVENTION

Integrated Circuit (IC) devices typically include numerous transistors that are fabricated on, for example, silicon wafers. There are several types of IC devices, including Application Specific Integrated Circuit (ASIC) devices and Programmable Logic Devices (PLDs). ASIC devices have internal circuitry including logic elements connected by dedicated (hard-wired) interconnect lines such that each ASIC device performs a predetermined (fixed) logic operation. ASIC devices also have dedicated input pins for receiving input signals from other devices, and dedicated output pins (terminals) for transmitting output signals to other devices. In contrast to ASIC devices, PLDs have internal circuitry including undedicated (user-configurable) logic elements and interconnect resources that are programmable to implement user-defined logic operations (that is, a user's circuit design). PLD pins are typically connected to the logic elements and interconnect resources through user programmable input/output (I/O) interface circuits.

Figure 1:
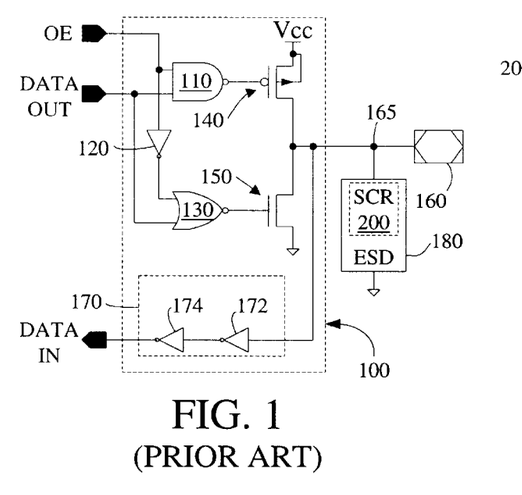
FIG. 1 is a diagram showing a portion of a known Programmable Logic Device (PLD).

FIG. 1 is a diagram showing a portion of a PLD that includes a known I/O circuit 100 connected to a pin 160 of the PLD. FIG. 1 also shows an electrostatic discharge (ESD) protection circuit 180 that is connected between ground and a node 165, which is located on a path on which signals are passed between pin 160 and I/O circuit 100.

I/O circuit 100 operates in either an input mode or an output mode in accordance with an output enable (OE) signal that is generated by the internal logic circuitry or transmitted on a global bus line of the PLD. The OE signal is provided to the first input terminal of a two-input NAND gate 110, and is inverted by an inverter 120 and applied to the first input terminal of a two-input NOR gate 130.

I/O circuit 100 also receives data output (DATA OUT) signals from internal circuitry of the PLD. The DATA OUT signals are provided to the second input terminals of NAND gate 110 and NOR gate 130. The output signal from NAND gate 110 is transmitted to the gate of a PMOS pull-up transistor 140 that is connected between Vcc and pin 160. The output signal from NOR gate 130 is transmitted to the gate of an NMOS pull-down transistor 150 that is connected between pin 160 and ground. In the output mode, a high OE signal causes pull-up transistor 140 and pull-down transistor 150 to generate high (Vcc) or low (0V or ground) signals on pin 160 in response to DATA OUT signals. In the input mode, signals received on pin 160 are transmitted through an input buffer 170, which includes serially-connected inverters 172 and 174, to a DATA IN line that transmits data input signals to the internal circuitry of the PLD.

ESD protection circuit 180 is provided to protect I/O circuit 100 from electrostatic discharge generated on pin 160 during shipping and handling of the host PLD. ESD protection circuit 180 typically includes one or more ESD protection devices that transmit these voltage pulses to ground, thereby protecting I/O circuit 100 from damage. As shown in FIG. 1, one such ESD protection device is a Silicon Controlled Rectifier (SCR) 200.

SCRs, also known as thyristors, are devices that are used extensively in power IC device applications because of their ability to switch from a very high impedance state to a very low impedance state. For the same reason, SCRs can also be used as very efficient ESD protection devices. Specifically, SCRs can conduct large currents at relatively low voltages, so the power dissipated (and resulting heat generation) is relatively low. Further, SCRs are recognized as being highly reliable in ESD protection device applications.

Figure 2:
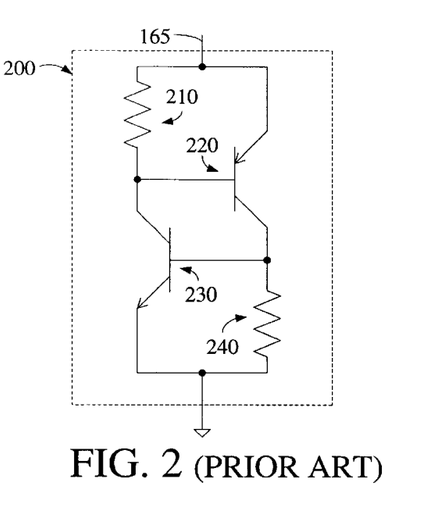
FIG. 2 is a circuit diagram showing a conventional Silicon Controlled Rectifier (SCR).

FIG. 2 shows SCR 200 that is implemented as an ESD protection device in ESD protection circuit 180 (see FIG. 1). SCR 200 includes a first resistance element 210, a pnp transistor 220, a npn transistor 230 and a second resistance element 240. First resistance element 210 has a first terminal connected to node 165 (see FIG. 1), and a second terminal connected to both the base of pnp transistor 220 and to the collector of npn transistor 230. The emitter of pnp transistor 220 is connected to node 165, and the collector of pnp transistor 220 is connected to both the base of npn transistor 230 and a first terminal of second resistance element 240. The emitter of npn transistor 230 and a second terminal of second resistance element 240 are connected to ground.

Figure 3:
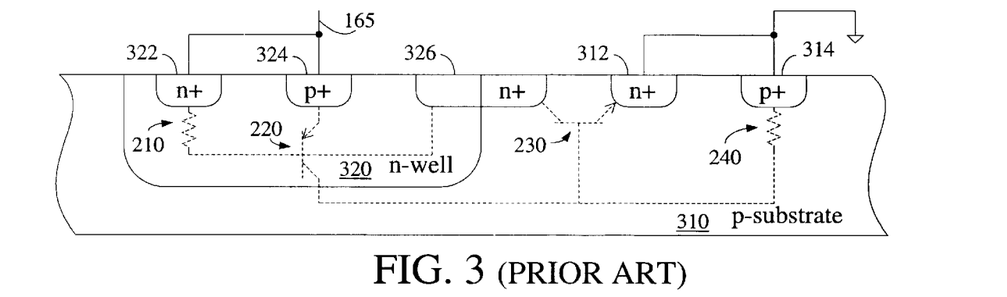
FIG. 3 is a cross-sectional side view showing the conventional SCR of FIG. 2 as implemented using CMOS technology.

FIG. 3 is a cross-sectional side view showing an embodiment of SCR 200 as it is implemented on a p-type substrate 310 according to known CMOS techniques. First resistance element 210 and pnp transistor 220 are implemented in an n-well region 320 formed in p-substrate 310 by a first n+ region 322 and a first p+ region 324. Npn transistor 230 and second resistance element 240 are implemented in p-substrate 310 by a second n+ region 312 and a second p+ region 314, and by a third n+ region that extends from p-substrate 310 into n-well region 320. Node 165 is connected to first n+ region 322 and first p+ region 324. Second n+ region 312 and second p+ region 314 are connected to ground (as is p-substrate 310).

Figure 4:
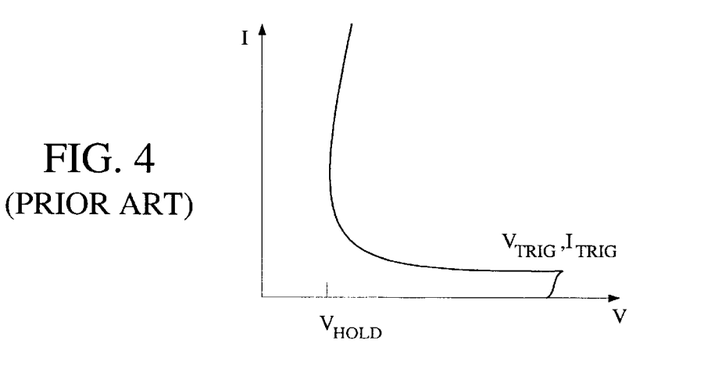
FIG. 4 is an I–V curve illustrating the operation of the conventional SCR shown in FIG. 2.

FIG. 4 shows an I–V curve that illustrates the operation of SCR 200. SCR 200 is initially in an unlatched (i.e., open circuit) state. When an ESD event occurs and a voltage pulse equal to or greater than the trigger voltage ($V_{TRIG}$) is applied to pin 160, SCR 200 is triggered (turned on), thereby protecting I/O circuit 100 by clamping node 165 to a holding voltage ($V_{HOLD}$), which is less than $V_{TRIG}$. In particular, when a voltage level at node 165 is equal to or exceeds $V_{TRIG}$, the collector-base junction of npn transistor 230 begins to leak (break down). The resulting current flow through second resistor element 240 forward biases the base-emitter junction of npn transistor 230, thereby turning on npn transistor 230. With npn transistor 230 turned on, the current passing through first resistor 210 and npn transistor 230 causes the base voltage of pnp transistor 220 to drop, thereby forward biasing the base-emitter junction and turning on pnp transistor 220. The current through pnp transistor 220 and second resistance element 240 provides a positive feedback to further turn on npn transistor 230, thereby latching SCR 200. When latched, the voltage across SCR 200 drops to $V_{HOLD}$, thereby conducting large currents (i.e., significantly greater than the trigger current $I_{TRIG}$) to ground. SCR 200 remains latched until the voltage at pin 160 drops to approximately $V_{HOLD}$ (e.g., 2 to 5 volts), at which time pnp transistor 220 and npn transistor 230 turn off, thereby unlatching SCR 200.

A problem associated with the use of SCR 200 in ESD protection circuit 180 arises during normal operation of the host PLD (i.e., after power is supplied to the host PLD). During normal operation, signals applied to pin 160 are typically between zero and five volts. However, occasional voltage spikes (i.e., above the normal signal voltage levels)

may be applied to pins 160 during operation. If the voltage spike is above $V_{TRIG}$ (for example, 7 to 9 volts), SCR 200 is triggered and the energy of the voltage spike is routed to ground, thereby providing the beneficial effect of preventing the voltage spike from damaging, for example, I/O circuit 100 (see FIG. 1). However, unlike ESD events, the voltage on pin 160 may not drop below $V_{HOLD}$ after the voltage spike ends (e.g., pin 160 may be maintained at 5 volts after the voltage spike). This creates a problem in that SCR 200 remains latched after the voltage spike, and the steady-state signal intended for I/O circuit 100 is instead sunk to ground, thereby potentially causing the PLD to malfunction. Because of this potential problem, SCRs are not widely utilized by circuit designers as ESD protection devices.

What is needed is an improved SCR that reliably triggers to provide ESD protection during non-operation of a host IC device, and reliably switches off after a voltage spike during operation of the IC device, thereby avoiding the above-mentioned problem associated with known SCRs.

SUMMARY OF THE INVENTION

The present invention is directed to an electrostatic discharge (ESD) protection circuit including a triple-well Silicon Controlled Rectifier (SCR) whose holding voltage is controlled by a control circuit to provide ESD protection during non-operation of a host IC device, and to reliably switch off after a voltage spike during normal operation.

The triple-well SCR is connected between a first node (e.g., an I/O pin of an IC device) and a second node. The triple-well SCR operates in a manner similar to that of conventional SCRs, but is constructed such that both the first node and the second node are isolated from the substrate upon which the ESD protection circuit is fabricated. By isolating the triple-well SCR from the substrate (i.e., ground), it is possible to provide the control circuit between the second node and ground. Conventional SCRs (discussed above) have one terminal tied to ground through the substrate, so a control circuit cannot control the holding voltage of a conventional SCR. Therefore, the triple-well SCR structure of the present invention provides significant advantages over conventional SCRs.

In accordance with one embodiment, the triple-well SCR is fabricated using CMOS technology on a P-type semiconductor substrate. The triple-well SCR includes an n-well region formed in the p-type substrate, and a p-well region formed in the n-well region such that the p-well region is isolated from the p-type substrate by the n-well region. A first resistance element and a first transistor are formed in the n-well region, and a second transistor and a second resistance element formed in the p-well region. In particular, the first transistor and the first resistance element are formed by a first p-type heavily doped region and a first n-type heavily-doped region located in the n-well region, and the second resistance element and the second transistor are formed by a second p-type heavily-doped region and a second n-type heavily doped region located in the p-well region. In addition, a third p-type heavily doped region is formed in the substrate that extends from the p-well region into the n-well region to reduce the trigger voltage of the triple-well SCR.

The control circuit of the ESD protection device is provided between the second node and ground, and controls the voltage level at the second node such that the potential across the triple-well SCR is selectively controlled to be less the holding voltage of the triple-well SCR after a voltage spike. Specifically, the control circuit operates such that the triple-well SCR is reliably switched off (or remains switched off) after a voltage pulse during normal operation. Because the control circuit either prevents triggering of the triple-well SCR during normal operation, or reliably switches off the triple-well SCR after a voltage spike, the IC device malfunction problems associated with conventional SCRs are avoided.

In accordance with a first embodiment of the invention, the control circuit of the ESD protection device includes a capacitor connected between the triple-well SCR and ground. When the triple-well SCR is subjected to an ESD event or a voltage spike, the resulting energy is initially transmitted through the triple-well SCR and the capacitor to ground, thereby providing effective protection. Subsequently, the capacitor gradually charges during the ESD event or voltage spike, thereby gradually reducing the voltage across the triple-well SCR until the voltage across the triple-well SCR is less than its holding voltage and the triple-well SCR switches off. Because the capacitor continues to charge while the triple-well SCR is triggered, the triple-well SCR is reliably switched off even if the pin to which the ESD protection circuit is connected is maintained at a voltage level above the holding voltage of the triple-well SCR.

In accordance with a second embodiment of the present invention, the control circuit of the ESD protection device includes a switch circuit that is controlled by the system voltage (Vcc) of the host IC device. The switch circuit is implemented, for example, by a PMOS transistor connected between the triple-well SCR and ground that has a gate connected to the system voltage (Vcc) of the host IC device. Before power is applied to the IC device (i.e., Vcc is zero), the switch is closed such that the ESD protection circuit is enabled (i.e., a path is provided between the triple-well SCR and ground for discharging ESD events). After power is applied to the IC device, the switch circuit is opened, thereby disabling the ESD protection circuit. A benefit of the second embodiment is that the ESD protection circuit remains enabled during prolonged ESD events.

In accordance with a third embodiment of the present invention, the control circuit of the ESD protection device includes a switch circuit connected in parallel with a capacitor. The switch structure provides a closed circuit for reliably discharging ESD pulses passed through the triple-well SCR before power is applied to the IC circuit. When power is applied, the switch circuit opens, and voltage spikes are discharged through the triple-well SCR and the capacitor. The capacitor dynamically alters the holding voltage of the triple-well SCR so that the triple-well SCR is reliably turned off.

In accordance with another aspect of the present invention, an IC device includes a plurality of ESD protection circuits that include triple-well SCRs. Each ESD protection circuit is connected to a node located between an I/O pin and an associated interface circuit that are used to provide signals to internal circuitry of the IC device.

In accordance with a fourth embodiment of the invention, the IC device includes a bus that extends along a periphery of the IC device, and the triple-well SCR of each ESD protection circuit is connected between an associated one of the I/O pins of the IC device and the bus. The bus either has sufficient capacitance, or is connected to ground through a discrete capacitor such that the bus forms a single control circuit that is used by all of the ESD protection circuits. Therefore, the ESD protection circuit of the fourth embodiment provides the benefits of the first embodiment without requiring multiple capacitor elements.

In accordance with a fifth embodiment of the present invention, the IC device includes a bus that extends along a periphery of the IC device, and each ESD protection circuit includes a triple-well SCR and a switch circuit. The triple-well SCR is connected between an associated one of the I/O pins of the IC device and a node. The switch circuit and the bus are connected in parallel between the triple-well SCR and ground. The switch circuit of each ESD protection circuit is implemented, for example, by a PMOS transistor connected between the triple-well SCR and ground that has a gate connected to the system voltage (Vcc) of the host IC device. The bus either has sufficient capacitance, or is connected to ground through a discrete capacitor such that the bus forms a single control circuit that is used by all of the ESD protection circuits. Therefore, the ESD protection circuit of the fifth embodiment provides the benefits of the third embodiment without requiring multiple capacitor elements.

DETAILED DESCRIPTION OF THE DRAWINGS

The present invention is directed to a triple-well Silicon Controlled Rectifier (SCR) that is utilized, for example, in the electrostatic discharge (ESD) protection circuits of integrated circuit (IC) devices, such as Programmable Logic Devices (PLDs). Although SCRs are described herein in the context of ESD protection circuits for PLDs, the disclosed SCRs may also be implemented in other circuit structures and in other types of IC devices.

Figure 5:
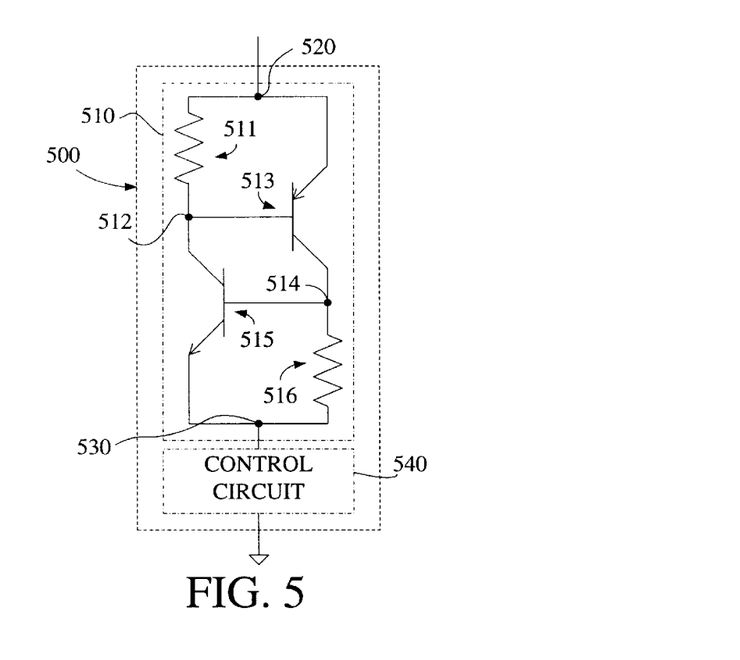
FIG. 5 is a diagram showing an ESD protection circuit according to the present invention.

FIG. 5 is a simplified circuit diagram showing an ESD protection circuit 500 in accordance with the present invention. ESD protection circuit 500 includes a triple-well SCR 510 connected between a first node 520 and a second node 530, and a control circuit 540 connected between second node 530 and ground (voltage source).

Triple-well SCR 510 includes a first resistance element 511, a first (pnp) transistor 513, a second (npn) transistor 515 and a second resistance element 516. First resistance element 511 is connected between first node 520 and a third node 512. First transistor 513 has a first terminal (emitter) connected to first node 520, a base connected to third node 512, and a second terminal (collector) connected to a fourth node 514. Second transistor 515 has a first terminal (collector) connected to third node 512, a base connected to fourth node 514, and a second terminal (emitter) connected to second node 530. Finally, second resistance element 516 is connected between fourth node 514 and second node 530.

Figure 6:
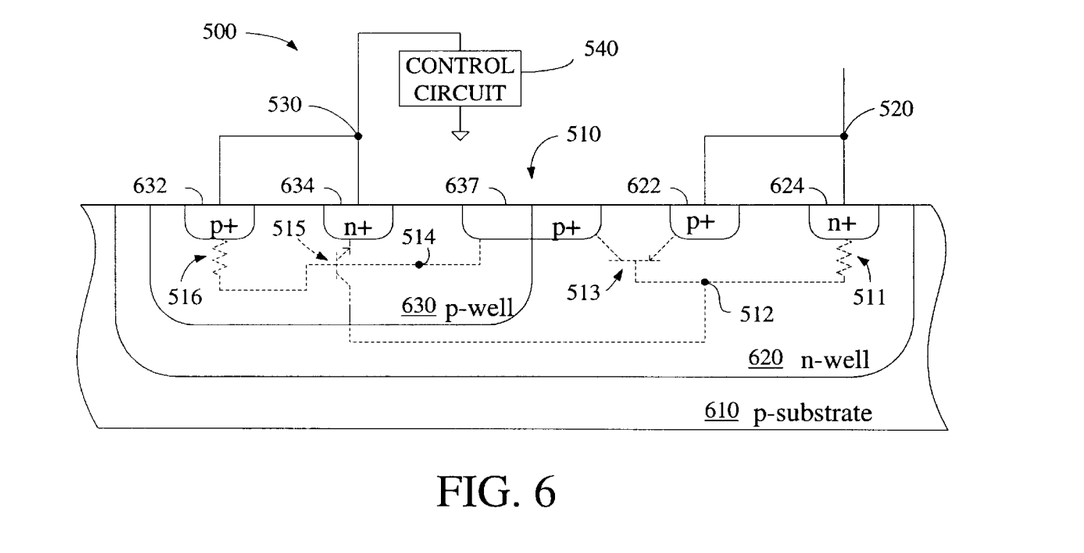
FIG. 6 is a cross-sectional side view showing the ESD protection device of the present invention as implemented using CMOS technology.

FIG. 6 is a simplified cross-sectional side view showing triple-well SCR 510 of ESD protection circuit 500 as implemented using CMOS technology. Triple-well SCR 510 is formed in a p-substrate 610 that includes an n-well region 620 and a p-well region 630. P-well region 630 is located within n-well region 620, which in turn is located in p-substrate 610. First (pnp) transistor 513 and first resistance element 511 are respectively implemented in n-well region 620 by a first p+ (heavily doped) region 622 and a first n+ (heavily doped) region 624. Second resistance element 516 and second (npn) transistor 515 are respectively implemented in p-well region 630 by a second p+ region 632 and a second n+ region 634. A third p+ region 636 extends from p-well region 630 into n-well region 620 that facilitates current flow from the second terminal (collector) of first transistor 513 to the base of second transistor 515 and second resistance element 516 in order to reduce the trigger voltage of triple-well SCR 510. First node 520 is connected to first p+ region 622 and first n+ region 624, and second node 530 is connected to second p+ region 632 and second n+ region 634. For convenience, third node 512 and fourth node 514 are identified on the dashed line indicating current paths between the various elements of triple-well SCR 510. The triple-well CMOS arrangement described above is formed using known fabrication techniques.

Control circuit 540 is provided between second node 530 and ground, and controls the voltage level at second node 530 such that the potential across triple-well SCR 510 (i.e., between first node 520 and second node 530) is selectively controlled to be less the holding voltage of triple-well SCR 510 after a voltage spike. Specifically, control circuit 540 operates such that triple-well SCR 510 is reliably switched off (or remains switched off) after a voltage pulse during normal operation. Because control circuit 540 either prevents triggering of triple-well SCR 510 during normal operation, or reliably switches off triple-well SCR 510 after a voltage spike, the IC device malfunction problems associated with conventional SCRs are avoided.

Operation of ESD protection device 500 during non-operation (e.g., before power is applied) and during operation (e.g., power is applied) of a host IC device (not shown) will now be discussed.

During non-operation of a host IC device, ESD protection circuit 500 operates in a manner similar to that of prior art SCR 200 (discussed above). That is, triple-well SCR 510 is initially in an unlatched (i.e., open circuit) state during non-operation of the host IC device. Control circuit 540 is closed during non-operation such that essentially zero volts exist across control circuit 540. When an ESD event occurs and a voltage pulse equal to or greater than a trigger voltage ($V_{TRIG}$) of triple-well SCR 510 is applied to node 520, triple-well SCR 510 is triggered (turned on) in a manner similar to that described above with respect to prior art SCR 200. Specifically, when both first transistor 513 and second transistor 515 of triple-well SCR 510 are turned on, first node 520 is clamped to the holding voltage ($V_{HOLD}$) of triple-well SCR 510.

During operation of a host IC device, control circuit 540 selectively controls the voltage across triple-well SCR 510 such that it is less the holding voltage of triple-well SCR 510 after a voltage spike. In first and third embodiments (described below), control circuit 540 operates to reliably switch off triple-well SCR 510 after a voltage pulse during normal operation. In a second embodiment, a switching circuit controlled by the system voltage of the host IC device remains open (switched off) during normal operation.

Several embodiments showing specific control circuits 540 will now be described.

Figure 7:
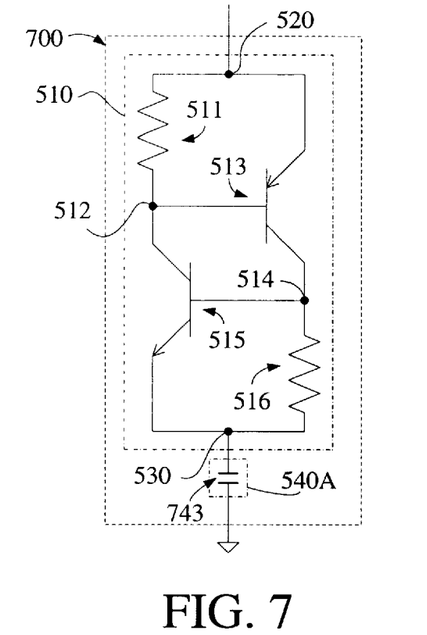
FIG. 7 is a diagram showing an SCR according to a first embodiment of the present invention.
Figure 8:
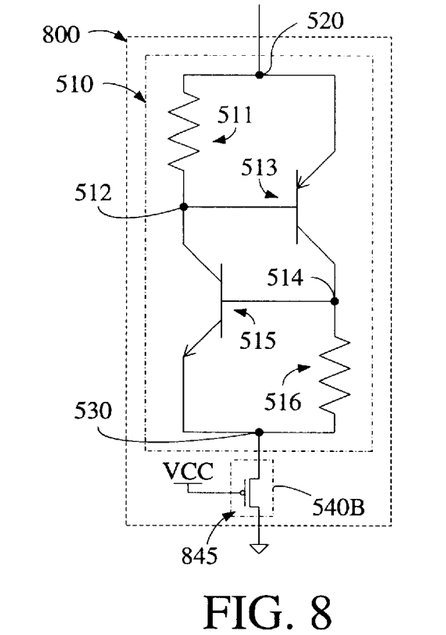
FIG. 8 is a diagram showing an SCR according to a second embodiment of the present invention.
Figure 9:
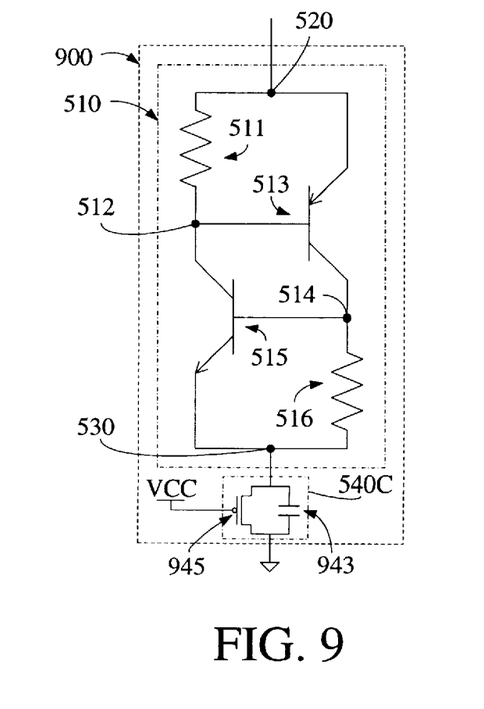
FIG. 9 is a diagram showing an SCR according to a third embodiment of the present invention.

FIGS. 7, 8 and 9 are diagrams showing ESD protection circuits in accordance with first, second and third embodiments of the present invention. In these embodiments, elements that are associated with like elements of ESD protection circuit 500 are identified with the same reference numbers. In particular, the triple-well SCRs used in the ESD protection circuits of the first, second and third embodiments is the same as triple-well SCR 510 discussed above, and are therefore identified with like reference numbers. For brevity, only those portions of the ESD protection circuits according to the first, second and third embodiments that differ from ESD protection circuit 500 will be discussed in detail.

FIG. 7 is a diagram showing an ESD protection circuit 700 in accordance with the first embodiment of the present invention. ESD protection circuit 700 includes triple-well SCR 510 and a control circuit 540A.

In accordance with the first embodiment, control circuit 540A includes a capacitor 743 connected between second node 530 and ground. During non-operation of a host IC device (e.g., before power is applied), triple-well SCR 510 is initially in an unlatched (i.e., open circuit) state. Capacitor 743 is fully discharged by leakage during non-operation such that essentially zero volts exists across capacitor 743. When an ESD event occurs and a voltage pulse equal to or greater than a trigger voltage ($V_{TRIG}$) of triple-well SCR 510 is applied to node 535, triple-well SCR 510 is triggered (turned on) in a manner similar to that described above with respect to prior art SCR 200. Initially, when both first transistor 513 and second transistor 515 of triple-well SCR 510 are turned on, first node 520 is clamped to the holding voltage ($V_{HOLD}$) of triple-well SCR 520 because of the zero voltage drop across capacitor 743. However, as the ESD event proceeds, capacitor 743 begins to collect a charge, thereby increasing the voltage drop across capacitor 743 and, as a consequence, the voltage level at first node 520. If the voltage level at first node 520 is allowed to increase significantly before the ESD event ends (i.e., if capacitor 743 charges too quickly), then the internal circuitry of the host IC device may be damaged. Therefore, it is desirable that capacitor 743 be large enough to prevent damage to the host IC device (i.e., such that capacitor 743 is not significantly charged during a typical ESD event).

In accordance with the first embodiment, control circuit 540A controls the potential across triple-well SCR 510 during operation of the host IC device such that triple-well SCR 510 is reliably switched off after a voltage pulse is received at node 520. Specifically, triple-well SCR 510 remains open (switched off) until a voltage pulse greater than $V_{TRIG}$ is received at node 520. As in the non-operation state, the voltage across capacitor 743 is essentially zero volts when triple-well SCR 510 is open during operation of the host IC device. When triple-well SCR 510 is triggered in response to a voltage pulse, the voltage across triple-well SCR 510 is initially equal to the level of the voltage pulse. Thereafter, capacitor 743 begins to charge in response to the current flowing through triple-well SCR 510 to ground, and continues to charge until triple-well SCR 510 switches off. Typically, the duration of such voltage pulses is short, and the signal level at node 520 falls back to normal operating levels. In accordance with the first embodiment, even if the normal operating level is greater than $V_{HOLD}$, triple-well SCR 510 is reliably turned off because of the charge on capacitor 743. That is, as capacitor 743 charges and the voltage across capacitor 743 increases, the voltage across triple-well SCR 510 is concomitantly reduced. When the voltage level at node 520 drops to normal operating levels (e.g. 5 volts), the voltage across triple-well SCR 510 is equal to this operating level minus the voltage across capacitor 743. When the difference between the voltage level at first node 520 and second node 530 is less than $V_{HOLD}$, triple-well SCR 510 switches off. In other words, because control circuit 540A gradually increases the voltage level at second node 530 to substantially the same voltage level as that of first node 520, triple-well SCR 510 is reliably turned off even if first node 520 is held at 5 volts. Therefore, the problem associated with conventional SCR 200 (i.e., that SCR 200 remains latched during normal operation of the IC device) is avoided by ESD protection circuit 700.

FIG. 8 is a simplified circuit diagram showing an ESD protection circuit 800 in accordance with the second embodiment of the present invention. ESD protection circuit 800 includes triple-well SCR 510 and a control circuit 540B.

In accordance with the second embodiment, control circuit 540B includes a switch circuit that controls the potential across triple-well SCR 510 by transmitting ESD energy to ground during non-operation of a host IC device, and by blocking current flow during normal operation. In one embodiment, control circuit 540B includes a PMOS transistor 845 that has a first terminal connected to second node 530, a second terminal connected to ground, and a gate connected to the system voltage (Vcc) of the host IC device. Before power is applied to the host IC device (i.e., the system voltage is zero), PMOS transistor 845 is closed such that ESD protection circuit 800 is enabled (i.e., a path is provided between triple-well SCR 510 and ground for discharging ESD events). After power is applied to the IC device, PMOS transistor 845 is opened, thereby disabling ESD protection circuit 800. A benefit of the second embodiment is the ESD protection circuit 800 remains enabled during prolonged ESD events. In contrast, if a voltage spike occurs during normal operation, ESD protection circuit 800 may not provide protection because the switch circuit may not turn on to enable triple-well SCR 510. However, if a switch circuit such as PMOS transistor 845 is used, triple-well SCR 510 may be enabled if the voltage at second node 530 is greater than one PMOS threshold voltage above Vcc.

FIG. 9 is a simplified circuit diagram showing an ESD protection circuit 900 in accordance with the third embodiment of the present invention. As in the first and second embodiments, ESD protection circuit 900 includes a triple-well SCR 510 connected between a first node 520 and a second node 530, and a control circuit 540C connected between second node 530 and ground.

In accordance with the third embodiment, control circuit 540C includes a capacitor 943 and a switch circuit 945 that are connected in parallel between second node 530 and ground. With this construction, the individual advantages of using capacitors and switches (discussed above) are combined. That is, during periods of non-operation of a host IC device, switch circuit 945 remains closed to conduct ESD discharge energy to ground, thereby providing the advantages discussed above with respect to ESD protection circuit 800. During normal operation of the host IC device, Vcc opens switch circuit 945, and voltage spikes applied to node 520 are discharged through triple-well SCR 510 and capacitor 943. As discussed above with respect to SCR 700, capacitor 943 dynamically alters the holding voltage of ESD protection circuit 900 so that ESD protection circuit 900 is reliably switched off after the voltage spike.

Both terminals of triple-well SCR 510 must be isolated from ground in order to incorporate control circuits 540A, 540B and 540C in the manner set forth above in ESD protection devices 700, 800 and 900. That is, it is not possible to simply connect any of control circuits 540A, 540B and 540C between SCR 200 and ground because one terminal of conventional SCR 200 is necessarily tied to ground through substrate 310 (see FIG. 3). In order to incorporate control circuits 540A, 540B and 540C into ESD protection devices 700, 800 and 900, it is necessary to isolate second node 530 of triple-well SCR 510 from ground.

In accordance with the present invention, triple-well SCR 510 is formed in N-well region 620 (see FIG. 6) so that both terminals of triple-well SCR 510 (respectively connected to node 520 and node 530) are isolated from substrate 610. By isolating triple-well SCR 510 from substrate 610 (i.e., ground), it is possible to incorporate control circuits 540A, 540B and 540C between triple-well SCR 510 and ground. Therefore, the triple-well SCR structure shown in FIG. 6 of the present invention provides significant advantages over conventional SCRs.

The following discussion illustrates several embodiments in which the ESD protection circuits of the present invention are utilized in IC devices, such as Programmable Logic Devices (PLDs). Although the ESD protection circuits are described as incorporated into PLDs, the disclosed ESD protection circuits may also be implemented in other types of IC devices.

Figure 10:
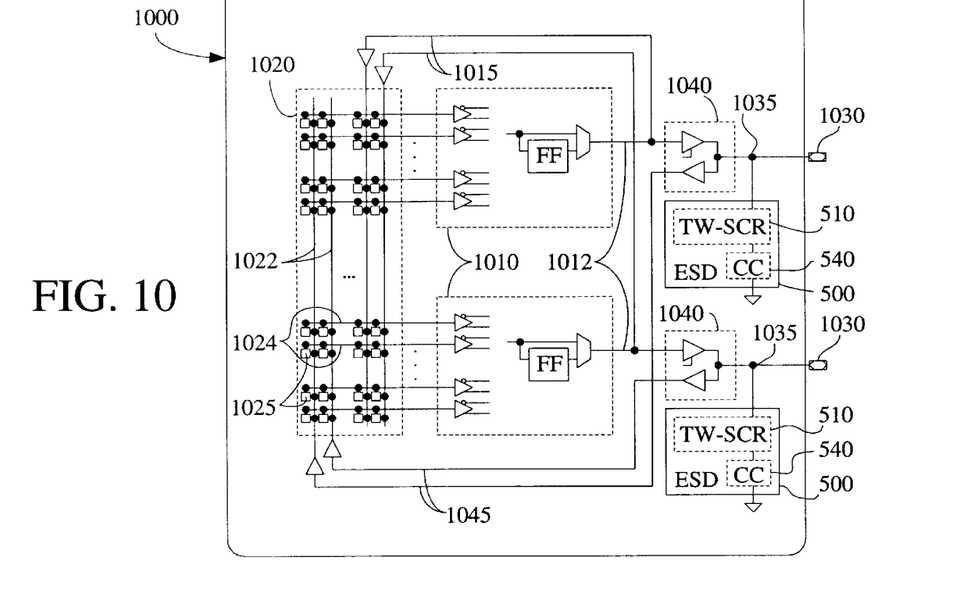
FIG. 10 is a simplified circuit diagram showing a Complex Programmable Logic Device (CPLD) that represents one type of IC device incorporating the ESD protection circuit of the present invention.

FIG. 10 shows a portion of a Complex Programmable Logic Device (CPLD) 1000, which represents one of several PLD types. CPLD 1000 has internal circuitry that includes configurable function blocks (FBs) 1010 and a programmable interconnect matrix 1020 that transmit signals to or receive signals from pins 1030 via interface circuits 1040. Although greatly simplified, the internal circuitry of CPLD 1000 is generally consistent with XC9500™ series CPLDs that are produced by Xilinx, Inc. of San Jose, Calif. The internal circuitry is briefly described in the following paragraphs. Additional detail regarding the structure and function of these circuits is provided in *The Programmable Logic Data Book*, published by Xilinx, Inc. (Version 1.02, 1996) on pages 3-3 through 3-13 (incorporated herein by reference).

Each FB 1010 of CPLD 1000 includes configurable combinational circuitry that is programmable to generate a desired logic function in response to input signals received from interconnect matrix 1020. Each FB 1010 is configurable to generate combinational output signals (i.e., the output signals are transmitted directly to an output line 1012), or registered output signals (i.e., the output signals are routed through a flip-flop (FF) to output line 1012). Each output signal on output line 1012 is either transmitted to an I/O circuit 1040, or is fed-back to interconnect matrix 1020 on feedback lines 1015. Typically, the combinational circuitry of all FBs 1010 in CPLD 1000 is identical.

Interconnect matrix 1020 is provided to selectively route feedback and input signals to designated FBs 1010 in accordance with a user's logic operation. Interconnect matrix 1020 includes word lines 1022, bit lines 1024 and programmable connection switches 1025. Each word line 1022 receives either a feedback signal from a feedback line 1015 or an input signal from an input line 1045. Each bit line 1024 is programmably coupled to several word lines 1022 via connection switches 1025. Connection switches 1025 typically include non-volatile memory devices such as EPROM, EEPROM or flash-EPROM cells. When programmed, each memory device is activated by high (or low) signals on an associated word line to pull-down the voltage on an associated bit line 1024. This allows interconnect matrix 1020 to route input and feedback signals onto a bit line 1024 that is coupled to a designated FB 1010.

In addition to FBs 1010 and interconnect matrix 1020, CPLD 1000 includes interface circuits 1040 that can be used for either signal input operations or signal output operations. An example of such an interface circuit is I/O circuit 100 (see FIG. 1). In IC devices that are not programmable, it is common for input signals to enter through interface circuits that operate only to transmit input signals from input pins to the internal circuitry of the IC device. Such interface circuits are well known. Referring again to FIG. 10, CPLD 1000 includes a plurality of ESD protection circuits 500 that are constructed in accordance with the present invention. Each ESD protection circuit 500 includes a triple-well SCR (TW-SCR) 510 and a control circuit (CC) 540 (one of control circuit embodiments 540A, 540B, or 540C). The operation of ESD protection circuit 500 is discussed above with respect to the first through third embodiments. These ESD protection circuits 500 are provided for preventing voltage spikes applied to pins 1030 from damaging the internal circuitry of CPLD 1000.

Figure 11:
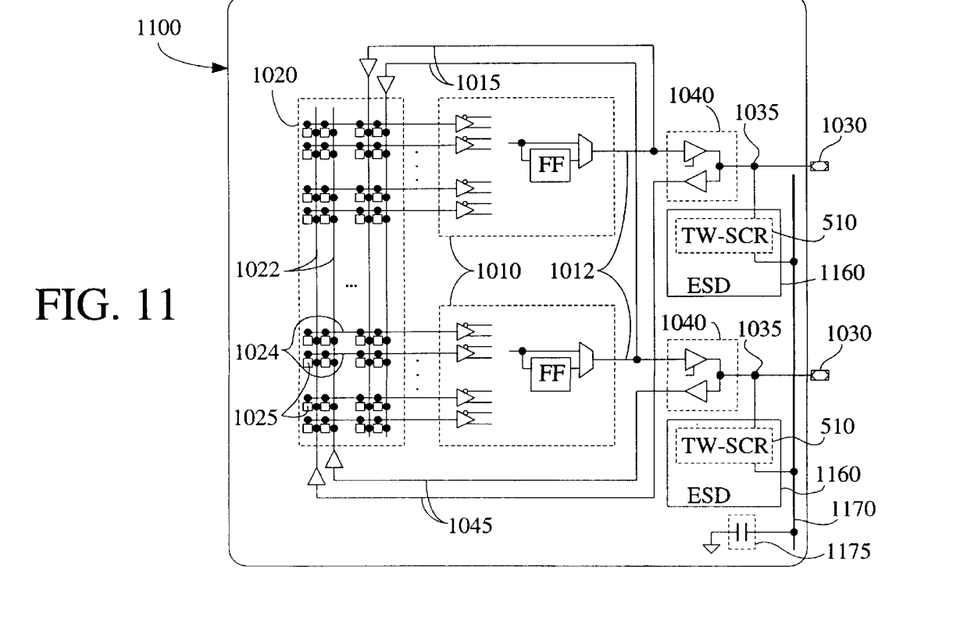
FIG. 11 is a simplified circuit diagram showing a CPLD in accordance with a fourth embodiment of the present invention.

FIG. 11 shows a portion of a CPLD 1100 in accordance with a fourth embodiment of the present invention. Portions of CPLD 1100 that are identical to those of CPLD 1000 are indicated with like reference numbers, and discussion of these portions is omitted for brevity.

In accordance with the fourth embodiment, CPLD 1100 includes a plurality of ESD protection devices 1160. Each ESD protection device 1160 includes a triple-well SCR (TW-SCR) 510 that is connected between node 1035 and a bus 1170. Bus 1170 extends along a periphery of CPLD 1100, and is connected to ground through an optional control circuit (CC) 540. Note that the capacitor of control circuit 540 may be the parasitic capacitance provided by bus 1170. For simplicity, bus 1170 is shown as extending along one edge of CPLD 1100. In another embodiment, bus 1170 may extend around the entire periphery of CPLD 1100 and connect to all triple-well SCRs 510 used in ESD protection circuits 1160.

In accordance with the fourth embodiment, due to the presence of optional control circuit 540 on bus 1170, each ESD protection circuit 1160 operates in a manner similar to that of ESD protection circuits 700, 800, or 900 (discussed above).

Figure 12:
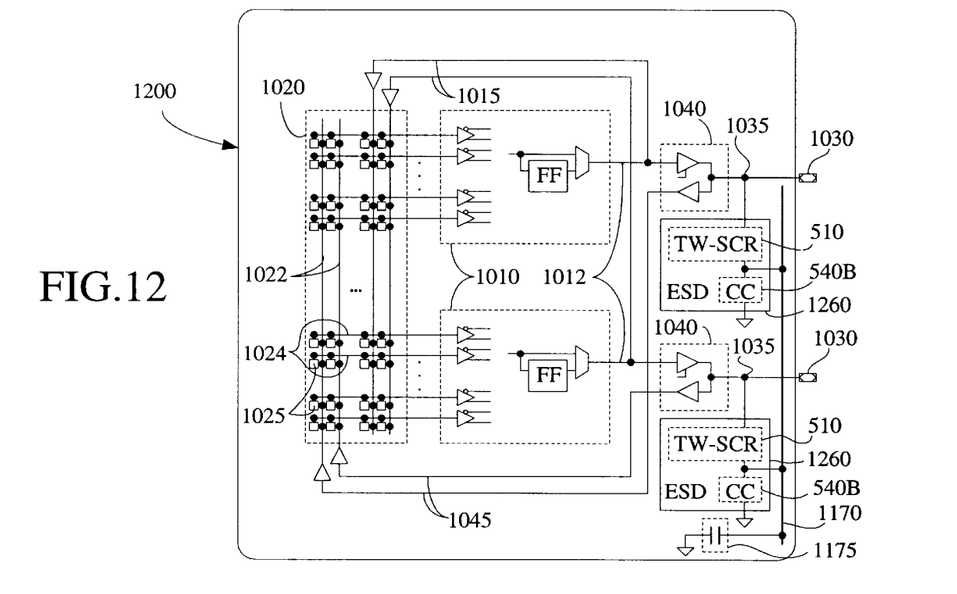
FIG. 12 is a simplified circuit diagram showing a CPLD in accordance with a fifth embodiment of the present invention.

FIG. 12 shows a portion of a CPLD 1200 in accordance with a fifth embodiment of the present invention. Portions of CPLD 1200 that are identical to those of CPLD 1000 and CPLD 1100 are indicated with like reference numbers, and discussion of these portions is omitted for brevity.

In accordance with the fifth embodiment, CPLD 1200 includes a plurality of ESD protection devices 1260. Each ESD protection device 1260 includes a triple-well SCR (TW-SCR) 510 and a control circuit 540 that are connected in parallel. Specifically, triple-well SCR 510 is connected between node 1035 and bus 1170, which is discussed above with respect to the fourth embodiment. Triple-well SCR 510 is also connected between node 1035 and control circuit 540, which is connected to ground. Once again, bus 1170 extends along a periphery of CPLD 1100, and is connected to ground through another optional control circuit (CC) 540.

Although the present invention has been described in considerable detail with reference to certain preferred embodiments thereof, other embodiments are possible. For example, the particular doping schemes utilized in FIG. 6 may be altered without changing the ultimate benefit of the disclosed SCR. Therefore, the spirit and scope of the appended claims should not be limited to the description of the preferred embodiments contained herein.

We claim:

1. An electrostatic discharge (ESD) protection device comprising:

a triple-well SCR connected between a first node and a second node, the triple-well SCR triggering to conduct current from the first node to the second node when a potential across the triple-well SCR exceeds a predetermined triggering voltage, and subsequently switching off to disconnect the first node from the second node when the potential across the triple-well SCR falls below a predetermined holding voltage;

a holding voltage control circuit connected between the second node and ground for controlling a voltage level at the second node such that the potential across the triple-well SCR is selectively controlled to be less than the predetermined holding voltage, thereby reliably switching off the triple-well SCR.

2. The ESD protection device according to claim 1, wherein the control circuit comprises a capacitor having a first terminal connected to the second node and a second terminal connected to ground.

3. The ESD protection device according to claim 1, wherein the control circuit comprises a normally-open switch circuit connected between the second node and ground, the normally-open switch being controlled by a system voltage source.

4. The ESD protection device according to claim 3, wherein the normally-open switch circuit comprises a PMOS transistor having a first terminal connected to the second node, a second terminal connected to ground, and a gate connected to the system voltage source.

5. The ESD protection device according to claim 1, wherein the control circuit comprises:

a capacitor having a first terminal connected to the second node and a second terminal connected to ground; and a normally-open switch circuit connected in parallel with the capacitor between the second node and ground, the normally-open switch being controlled by a system voltage source.

6. The ESD protection device according to claim 5, wherein the normally-open switch circuit comprises a PMOS transistor having a first terminal connected to the second node, a second terminal connected to ground, and a gate connected to the system voltage source.

7. The ESD protection device according to claim 1, wherein the triple-well SCR comprises:

a first resistance element located between the first node and a third node;

a first transistor having a first terminal connected to the first node, a base connected to the third node, and a second terminal connected to a fourth node;

a second transistor having a first terminal connected to the third node, a base connected to the fourth node, and a second terminal connected to the second node; and a second resistance element located between the fourth node and the second node.

8. A silicon controlled rectifier comprising:

a semiconductor substrate having a first conductivity type;

a first well region having a second conductivity type, opposing the first conductivity type, located in the semiconductor substrate;

a second well region having the first conductivity type located in the first well region such that the second well region is isolated from the semiconductor substrate;

a first resistance element and a first transistor formed in the first well region; and a second transistor and a second resistance element formed in the second well region.

9. The silicon controlled rectifier according to claim 8, wherein the first resistance element and the first transistor are formed by a first heavily doped region and a second heavily-doped region located in the first well region, and the second transistor and the second resistance element are formed by a third heavily-doped region and a fourth heavily doped region located in the second well region.

10. The silicon controlled rectifier according to claim 9, further comprising a fifth heavily-doped region that extends from the second well region into the first well region.

11. The silicon controlled rectifier according to claim 10, wherein the first well region is an n-type region, the second well region is a p-type region, the first, third and fifth heavily-doped regions are p-type heavily-doped regions, and the second and fourth heavily-doped regions are n-type heavily-doped regions.

12. The silicon controlled rectifier according to claim 9, wherein the third heavily doped region and the fourth heavily-doped region are connected to a node, and wherein the node is connected to ground through a control circuit.

13. An integrated circuit device comprising:

internal circuitry;

a pin connected to the internal circuitry;

an interface circuit coupled between the pin and the internal circuitry; and an electrostatic discharge protection device connected between a first node and ground, the first node being located on a path connecting the pin and the interface circuit, wherein the electrostatic discharge device comprises a triple-well SCR connected between the first node and a second node, the triple-well SCR triggering to conduct current from the first node to the second node when a potential across the triple-well SCR exceeds a predetermined triggering voltage, and subsequently switching off to disconnect the first node from the second node when the potential across the triple-well SCR falls below a predetermined holding voltage.

14. The integrated circuit device of claim 13, further comprising a holding voltage control circuit connected between the second node and ground for controlling a voltage level at the second node such that the potential across the triple-well SCR is selectively controlled to be less than the predetermined holding voltage, thereby reliably switching off the triple-well SCR.

15. The integrated circuit according to claim 14, wherein the control circuit comprises a capacitor having a first terminal connected to the second node and a second terminal connected to ground.

16. The integrated circuit according to claim 14, wherein the control circuit comprises a normally-open switch circuit connected between the second node and ground, the normally-open switch being controlled by a system voltage source.

17. The integrated circuit according to claim 14, wherein the control circuit comprises:
   a capacitor having a first terminal connected to the second node and a second terminal connected to ground; and
   a normally-open switch circuit connected in parallel with the capacitor between the second node and ground, the normally-open switch being controlled by a system voltage source.

18. The integrated circuit according to claim 13, wherein the triple-well SCR comprises:
   a first resistance element located between the first node and a third node;
   a first transistor having a first terminal connected to the first node, a base connected to the third node, and a second terminal connected to a fourth node;
   a second transistor having a first terminal connected to the third node, a base connected to the fourth node, and a second terminal connected to the second node; and
   a second resistance element located between the fourth node and the second node,
   wherein the first resistance element and the first transistor are formed in a first well region of a first conductivity type;
   wherein the second resistance element and the first transistor are formed in a second well region of a second conductivity type; and
   wherein the first well region is formed in a substrate of the second conductivity type, and the second well region is formed in the first well region such that the second well region is isolated from the substrate.

19. The integrated circuit device according to claim 13, wherein the SCR is connected to ground via a bus.

20. The integrated circuit device according to claim 19, further comprising a capacitor connected between the bus and ground.

21. The integrated circuit device according to claim 19, further comprising a control circuit connected in parallel with the bus between the silicon controlled rectifier and ground.

* * * * *